United States Patent [19]

Warther

[11] 4,118,696
[45] Oct. 3, 1978

[54] PRECISION VOLTAGE TO FREQUENCY CONVERTER FOR USE IN A/D CONVERTER

[75] Inventor: Donald Paul Warther, Newport Beach, Calif.

[73] Assignee: Hughes Aircraft Company, Culver City, Calif.

[21] Appl. No.: 745,036

[22] Filed: Nov. 24, 1976

[51] Int. Cl.² ............................................. H03K 13/20
[52] U.S. Cl. ........................... 340/347 NT; 324/78 D; 340/347 M
[58] Field of Search .................. 340/347 NT, 347 AD, 340/347 M; 324/99 D, 78 D; 350/96 B

[56] References Cited

U.S. PATENT DOCUMENTS

| | | | |
|---|---|---|---|
| 3,569,957 | 3/1971 | Masterson | 340/347 NT |
| 3,569,957 | 3/1971 | Masterson | 340/347 NT |
| 3,750,146 | 7/1973 | Lucas | 340/347 DA |
| 3,808,366 | 4/1974 | Wanamaker et al. | 325/38 R |
| 3,833,903 | 9/1974 | Gordon et al. | 340/347 AD |
| 3,879,724 | 4/1975 | McDonald | 340/347 NT |
| 3,940,759 | 2/1976 | Zitelli et al. | 340/347 CC |
| 3,997,894 | 12/1976 | Levine | 340/347 AD |
| 4,009,475 | 2/1977 | DeFreitas | 340/347 AD |

OTHER PUBLICATIONS

Hoeschele, Analog-to-Digital/Digital-to-Analog Conversion Techniques, J. Wiley & Sons, Inc., 1968, pp. 356, 357 & 380-384.
RCA Solid State Databook Series, SSD-203, 1972, p. 186.
Pressman, Design of Transistorized Circuits for Digital Computers, J. F. Rider Publisher, Inc., 1959, pp. 3-44 & 3-45.
DeFreitas, The Low-Cost Way to Send Digital Data . . . , Electronic Design, Jan. 18, 1974, pp. 68-71 & 73.
Stigliani, Light Interface Technology, 1971 IEEE International Electromagnetic Compatibility Symposium Record, Philadelphia, Pa., Jul. 13-15, 1971, pp. 316, 317.
Grob, Basic Television, McGraw-Hill Book Co., Inc., 1954, pp. 180, 181.

Primary Examiner—Thomas J. Sloyan
Attorney, Agent, or Firm—Gregory B. Wood; Martin E. Gerry; W. H. MacAllister

[57] ABSTRACT

An analog-to-frequency converter to provide an open-loop encoder of analog signals. An analog signal is injected into a voltage-to-frequency (VFO) converter to change the analog signal to a duty cycle having an UP-time to DOWN-time ratio equal to the ratio between the input analog voltage and an externally applied precision voltage level. The duty cycle signal is then "ANDED" with a clock signal to form a VFO signal pulse train which is essentially the clock signal during the UP time of the duty cycle signal. The maximum count of a clock signal counter determines the sampling period. The VFO pulses are accumulated during the sampling period so that when the clock signal counter reaches the maximum count, the accumulated number is transferred to a storage register and the accumulator reset to zero in preparation to receive and accumulate the VFO signals of the next sample period. This transfer is made in response to signals from a time-gate generator. The clock signal synchronizes the VFO converter and the time-gate generator so that the overall accuracy is a function of the clock's short-term stability rather than an accurate time-base signal pulse width. High VFO input to output isolation may be achieved by optically coupling the input to the output signal and providing transformer coupling between the power source and the output signal ground to thereby achieve a floating output voltage.

18 Claims, 4 Drawing Figures

PRECISION VOLTAGE TO FREQUENCY CONVERTER FOR USE IN A/D CONVERTER

BACKGROUND OF THE INVENTION

The present invention relates to analog-to-digital converters and particularly to open-loop analog-to-frequency type converters.

In many applications, it may be necessary or desirable to convert an analog signal to a digital signal. For example, data is frequently generated in the form of an analog signal. However, such analog signals are difficult to handle, process, and store for later use without introducing considerable error. In addition, analog signals which must be taken from a large number of sources will often accumulate at a rate which makes analysis and processing very difficult. It is desirable, therefore, to convert the analog signals to digital signals to permit the high speed processing made possible utilizing a digital computer. Such an analog-to-digital conversion is accomplished with a device which accepts an analog voltage signal at its input and produces a coded digital signal as its output. Because of the numerous and varied applications for analog-to-digital converters, many techniques have been devised to meet the requirements of the particular application. Thus, numerous analog-to-digital converters exist ranging from very slow and inexpensive devices to ultrafast, very expensive ones.

Despite their number, A/D converters can be generally placed in one of two major groups. The first major group utilizes the feedback technique and includes ramp and counter methods, successive approximation, subranging, non-linear conversion and the double and triple ramp techniques to name just a few. The second major group are the open-loop analog-to-digital techniques which include analog-to-pulsewidth, simultaneous conversion, cascade (or voltage doubling) conversion and analog-to-frequency conversion. The present invention is in this last category - namely an open-loop, analog-to-frequency type converter. A comprehensive summary of the various techniques of analog-to-digital conversion are included in *A/D Conversion Series — Part* 1, entitled "Analog-to-Digital Conversion Techniques" by Ed Renschler and published as "Application Note An-471" by Motorola Semiconductor Products, Inc. In particular, the analog-to-frequency concept generally utilized in the present invention is described on page 3. In general, a voltage-to-frequency converter circuit described produces a frequency which is a precise, linear function of the input analog voltage. This voltage-to-frequency converter signal is "ANDED" with a "fixed time base signal" which is a digital pulse whose ON time is known and must be very precise. In operation, the leading edge of the "fixed timebase signal" gates an oscillator frequency to a counter. After the counter has had the oscillator frequency applied to it for the duration of the fixed time-base signal, the trailing edge will gate off the counter, and its contents will be a digital representation of the analog input voltage.

While this technique may be adequate in some applications, accuracy limitations due to non-linearities in the voltage-to-frequency converter over the entire analog input range and the precision required in the time-base signal pulsewidth prevents its utilization in many applications. The present invention overcomes these difficulties by providing a stable reference voltage for the voltage-to-frequency converter which may be implemented utilizing essentially one precision part to circumvent the non-linearity problem. Furthermore, the dependence upon a time-base signal having a precise pulsewidth is eliminated by utilizing an oscillator or digital clock to synchronize the VFO and the time-gate generator so that the conversion of the voltage-to-frequency converter frequency output to a digital number is determined by a simple logic ratio. The overall accuracy is consequently a sole function of the oscillator's (digital clock's) short-term stability. As a result, the time gate required by the above reference to produce a precise "fixed time base signal" is eliminated.

SUMMARY OF THE INVENTION

The present invention comprises essentiallly a voltage-to-frequency converter for converting an analog signal input to a digital pulse train, a VFO pulse accumulator for accumulating the VFO signal pulses from the VFO circuit, and a converter control which comprises a clock counter and a time-gate generator. The time-gate generator generates pulses to enable the accumulated count in the VFO accumulator to transfer to a digital count storage register and to clear the VFO accumulator to zero in preparation to accumulate the VFO signal pulses of each new digital word. A digital clock synchronizes the VFO circuit, the clock counter, and the time-gate generator with the number of stages of the clock counter determining the sample period of the overall analog-to-digital converter. The time-gate generator periodically generates a first control signal which causes the count in the VFO pulse accumulator to transfer to the digital count storage register and a second control signal to reset the accumulator to zero in preparation for accumulating the VFO pulses for the next digital word. The binary accumulator and the clock counter will usually have an equal number of stages which will also be the number of bits of the resultant digital word. The resultant digital word is available from the digital count storage register.

The preferred VFO circuit utilized in the present invention comprises a transformer and associated circuitry to form the DC voltages necessary to power the various components. The transformer also provides voltage clocking isolation between the input and output circuitry while still assuring synchronization of the VFO and the accumulator and storage registers with the clock frequency. The overall accuracy and conversion gain of the analog-to-digital converter are primarily determined by the stability of a precision voltage source which generates a precision voltage equal to the full scale input of the converter.

To assure this full-scale operation, the analog input is first clamped between ground and the precision reference voltage and then injected into the inverting input of an operational amplifier. The output of a clocked flip-flop is then fed back to the non-inverting input of the operational amplifier in such a way that the average value of the fed-back voltage will be equal to the precision reference voltage times the duty-cycle factor. The operational amplifier, implemented in an integrating configuration, compares the analog input voltage at its inverting input with the fed-back signal from the duty-cycle flip-flop at is non-inverting input and integrates the difference. This difference is then injected into the input of the clock flip-flop which corrects the duty cycle in such a way that the duty-cycle factor times the precision reference voltage will be exactly equal to the analog input voltage. By sampling the flip-flop output at the same frequency as its clock, the duty-cycle becomes a frequency which is proportional to the analog input voltage relative to the precision reference voltage.

The output frequency may be coupled through an optical coupler and output buffering to generate the VFO pulse signal which is electrically isolated from the analog input. The VFO pulse signal pulses are accumulated during the sample period defined by the clock counter previously described. The accumulated pulse count is then stored in digital storage register at the sample rate and the overall conversion is complete.

It is thus the general object of the present invention to provide an analog-to-digital converter which is of the open-loop analog-to-frequency conversion type.

It is another object of the present invention to provide an analog-to-frequency type analog-to-digital converter without utilizing a fixed time-base signal.

It is yet another object of the present invention to provide an analog-to-frequency converter having an overall accuracy which is not a function of the stability of the digital scychronizing clock.

It is still another object of the present invention to provide an analog-to-frequency converter which may be electrically isolated from the input signal.

Yet another object of the present invention is to provide a VFO circuit whose overall accuracy in conversion gain are primarily determined by the stability of a precision voltage source.

Still another object of the present invention is to utilize an oscillator or digital clock to synchronize the VFO signal pulse train and the time-gate generator to thereby assure that the conversion of frequency to a digital number is determined by a simple logic ratio.

It is another object of the present invention to provide an analog-to-frequency type A/D converter having a voltage-to-frequency converter without accuracy limitations due to non-linearities.

BRIEF DESCRIPTION OF THE DRAWINGS

A complete understanding of the present invention and of the above and other objects and advantages thereof may be gained from a consideration of the following description of the preferred embodiments taken in conjunction with the accompanying drawings in which.

DETAILED DESCRIPTION OF THE PREFERRED EMBODIMENTS

Figure 1:
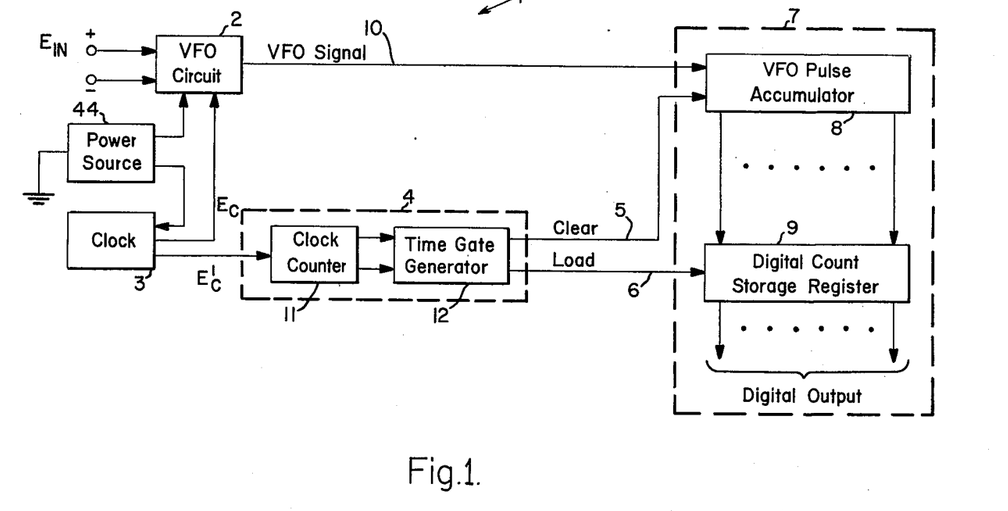
FIG. 1 is a simplified block diagram illustrative of the organization of the present invention.

Referring first to FIG. 1, the A/D converter 1 comprises a voltage-to-frequency (VFO) converter circuit 2 for receiving the analog signal $E_{IN}$ and generating a VFO signal pulse train. Coupled to VFO circuit 2 is clock 3 to provide periodic clock pulses to control and synchronize the VFO circuit with other A/D circuit components. It will be appreciated that clock 3 may be a sine wave or square wave oscillator or a digital clock or any other device which generates periodic circuit enabling voltage levels and that $E_c$ and $E_c'$ may be either the same or different so long as they are synchronized with each other. Clock 3 also provides clock pulses to converter control means 4 which comprises clock counter 11 and time-gate generator 12 which generates at least one control signal to define the sampling period. The VFO signal pulse train from VFO circuit 2 and the control signals generated by the converter control 4 are coupled to a digital word accumulator-storage means 7 which comprises VFO pulse accumulator 8 for receiving and accumulating the VFO signal pulses and digital count storage register 9 for periodically receiving at the end of each sample period the VFO pulse count accumulated in VFO pulse accumulator 8 to thereby provide a digital output from the digital count storage register. Also shown in FIG. 1 is power source 44 which provides the necessary voltages to both the VFO circuit 2 and digital clock 3.

Figure 2:
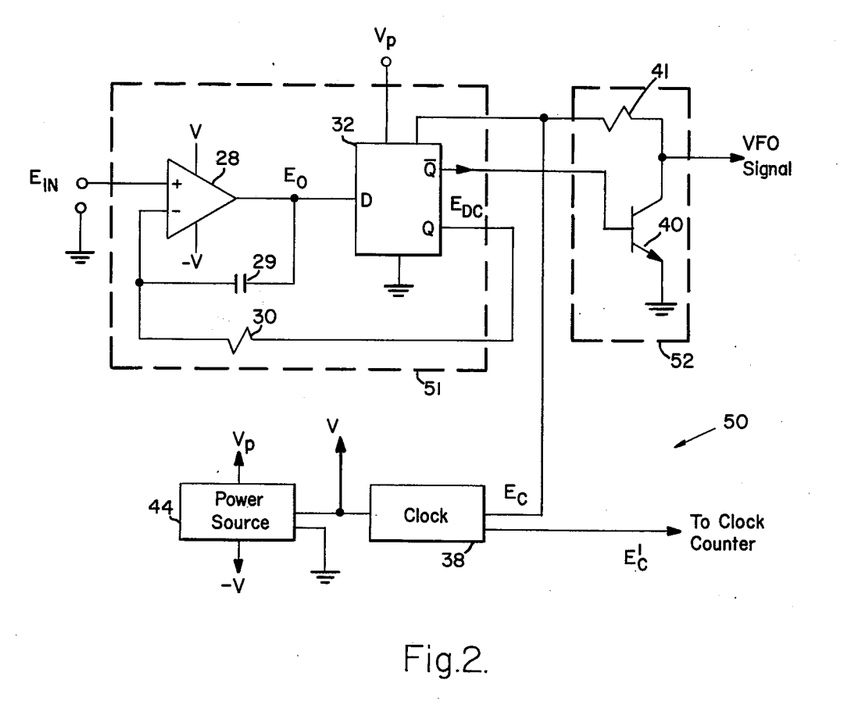
FIG. 2 is a simplified circuit diagram illustrating a typical VFO circuit with associated power source and clock.

Referring to FIG. 2, there is shown a detailed representative VFO circuit for generating a VFO pulse signal comprising a simplified analog to duty cycle conversion means 51 and a VFO pulse enable means 52. Also shown is power source 44 to provide voltages V and $-V$ to simplified analog-to-duty-cycle conversion means 51 and voltage V or $-V$ to clock 38 and a precision voltage $V_P$ to simplified analog-to-duty-cycle conversion means 51. The conversion means 51 comprises operational amplifier 28 oriented to receive the input signal voltage $E_{IN}$ at the non-inverting input terminal. It will be appreciated, of course, that $E_{IN}$ is clamped utilizing well-known clamping circuitry (not shown) to vary between ground and the precision voltage $V_P$ or some maximum voltage. It will also be appreciated that the accuracy of the A/D conversion depends on the precision of the maximum voltage (taken as $V_P$ herein) this maximum voltage need not be a precision voltage if less accuracy is acceptable. Integrating capacitor 29 is coupled between the output and the inverting input of operational amplifier 28. Power is supplied to operational amplifier 28 by power source 44. The output of operational amplifier 28 is also coupled to the input of clocked threshold flip-flop 32 which is preferably (although not necessarily) powered by precision voltage $V_P$ from power source 44. Clocked threshold flip-flop 32 is clocked by the clock signal $E_c$ from clock 38. The non-inverting output Q of flip-flop 32 is coupled back through time-constant resistor 30 into the inverting input of operational amplifier 28. The value of resistor 30 is preferably chosen so that the integration time constant is on the same order of magnitude as the clock frequency.

The required duty-cycle signal may be obtained at the inverting output $\overline{Q}$ of flip-flop 32 and will have a down time-to-up time ratio proportional to the ratio between the input voltage $E_{IN}$ and the precision voltage $V_P$ which is also the maximum value $E_{IN}$ will attain. The duty-cycle signal $E_{DC}$ is coupled into the base of switching transistor 40 to control the ON-OFF sequence of transistor 40. The clock signal $E_c$ is coupled to the collector of transistor 40 through resistor 41 and the emitter of transistor 40 is coupled to ground. The VFO signal pulse train appears at the collector terminal of transistor 40.

Figure 4:
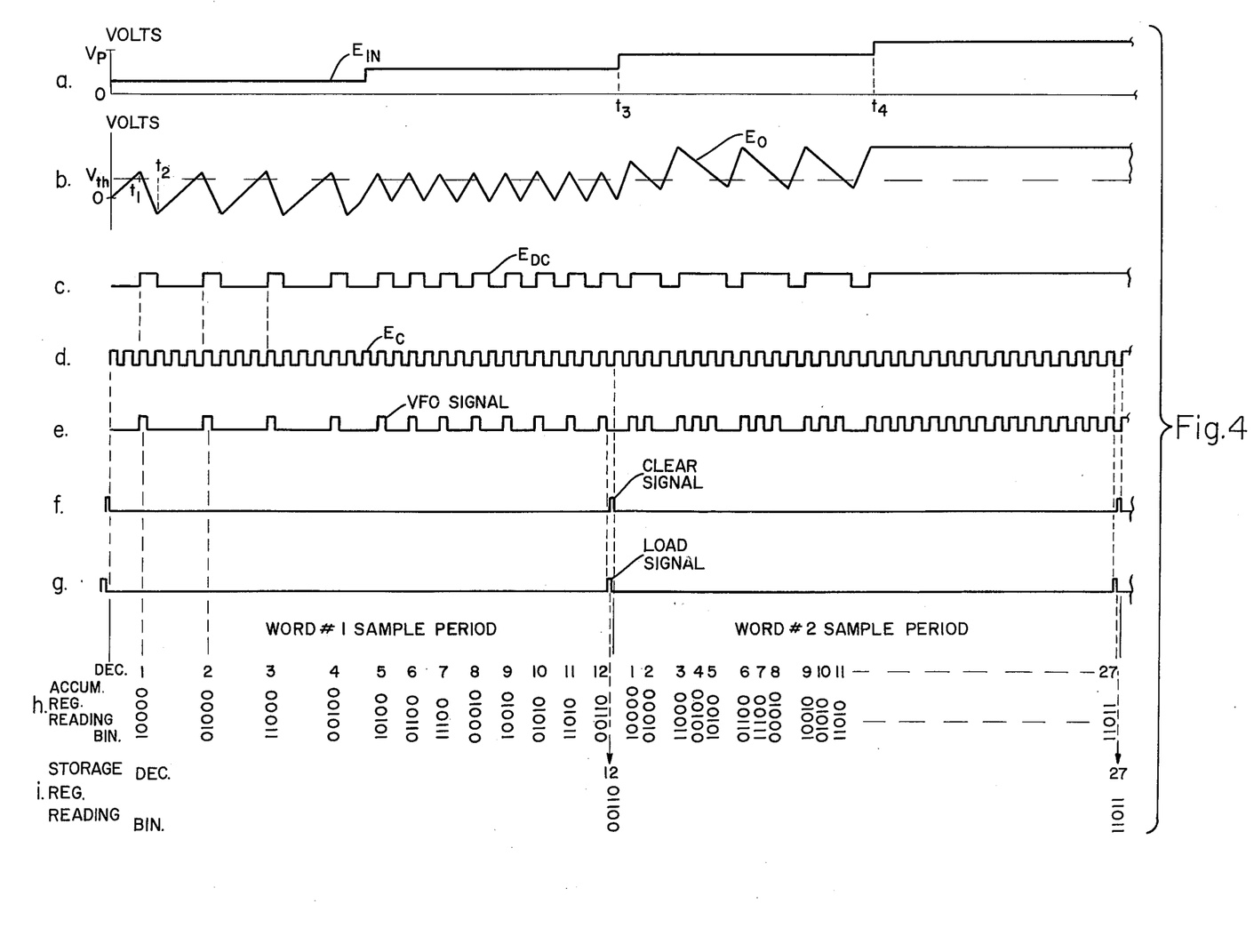
FIGS. 4a through 4i are plots illustrating signal wave forms appearing at various points in the circuits shown in FIGS. 1, 2 and 3, and are illustrative of the operation of the present invention.

The operation of the VFO circuit shown in FIG. 2 may be understood by reference to FIG. 4 which illustrates various time plots for the various voltages indicated in FIG. 2. Initially, an input signal $E_{IN}$ is introduced into the summing terminal of operational amplifier 28. The analog input signal $E_{IN}$ is preprocessed to assure that it will vary only between zero volts and the precision voltage $V_p$. Of course, it will be appreciated that a second precision (or minimum) voltage may be utilized instead of ground. Thus, $E_{IN}$ will always be a fraction of the difference between precision voltages or $V_p$ if one precision voltage is ground. An $E_{IN}$ signal to illustrate the circuit's operation is shown in FIG. 4a. It will be noted, however, that $E_{IN}$ will normally be a continuous analog signal without steps. The resulting output voltage $E_O$ from operational amplifier 28 is illustrated in FIG. 4b. This output is fed back to the inverting input of operational amplifier 28 through integrating capacitor 29. Since the inverting input of operational amplifier 28 always tries to be equal to the non-inverting input, the voltage $E_O$ begins to build up as shown in FIG. 4b. When $E_O$ builds to a point where it exceeds the threshold of the clocked flip-flop 32 ($V_{th}$), the non-inverting output of flip-flop 32 will change from zero (assuming it was initially at zero volts) to a voltage equal to $V_p$ at the next clock pulse. This is indicated by the plot of $E_{DC}$ in FIG. 4c.

When the non-inverting output of the flip-flop is at the non-zero voltage, $E_O$ will integrate down because now the voltage difference between the non-inverting input of operational amplifier 28 and the non-inverting output of flip-flop 32 is greater than $E_{IN}$. When the output $E_O$ has integrated down below the flip-flop threshold, the non-inverting output of the flip-flop 32 will return to zero upon the occurrence of the next clock pulse.

Conventional operational amplifier operation indicates that the rate of change of $E_O$ follows the equation $$\Delta E_O / \Delta t = -E_d / RC$$

where $E_d$ is the difference between $E_{DC}$ and the analog voltage $E_{IN}$ and R is the resistance of resistor 30 and C is the capacitance of capacitor 29. Thus, referring to FIG. 4a, if $E_{IN}$ is initially ¼ the maximum precision voltage $V_p$, then $E_O$, shown in FIG. 4b, will integrate up at the normalized rate of $-(E_{DC} - E_{IN})$ which may be taken in the example shown in FIG. 4 to have a value of one. Since the output of flip-flop 32 will change only on the leading edge of a clock pulse, and since the flip-flop output $E_{DC}$ will acquire a voltage $V_p$ only if the input $E_O$ exceeds the threshold voltage $V_{th}$, $E_O$ will continue to increase at a normalized slope of one until time $t_1$ at which time the non-inverting output Q of flip-flop 32 will change from zero volts to $V_p$ volts. The voltage $E_d$ will immediately change to a value of $V_p - E_{IN}$ and the rate of integrating down will change to a normalized value of $-(E_{DC} - E_{IN})$ or a value of three in the present example. As can be seen, since $E_{IN}$ is only one-fourth of the maximum voltage possible, the UP integration time will be three-fourths of the duty cycle while the down integration time (from $t_1$ to $t_2$ on FIG. 4b) will be one-fourth of the duty-cycle time. Referring to FIG. 4c, which plots $E_{DC}$ with time, it can be seen that initially $E_{DC}$ has a value $V_p$ one-fourth of the time and a value zero, three-fourths of the time.

A contrasting duty-cycle illustration is shown when $E_{IN}$ is equal to three-fourths of the maximum voltage possible $V_p$ between time $t_3$ and time $t_4$. In that case, the time taken to integrate UP is one-fourth of the duty cycle while the time taken to integrate DOWN to a point below the threshold is three-fourths of the duty cycle. Consequently, from FIG. 4c, $E_{DC}$ has a value equal to $V_p$ three-fourths of the time and a value equal to zero one-fourth of the time between times $t_3$ and $t_4$. It will be appreciated that signal $E_{DC}$ and $E_O$ are synchronized to the clock signal $E_c$ shown in FIG. 4d.

A VFO signal is generated from the duty-cycle output of flip-flop 32 utilizing the VFO pulse enable means 52. From FIG. 2 it is clear that when transistor 40 is conducting, the collector of transistor 40 will be at zero volts and when transistor 40 is not conducting, the VFO signal will be equal to $E_c$, as illustrated in FIG. 4d. Thus, by applying the inverted duty cycle signal $E_{DC}$ to the base of transistor 40 to turn transistor 40 on and off in response to the UP-DOWN sequence of $E_{DC}$, a VFO signal, as illustrated in FIG. 4e, will result. Thus, a VFO signal pulse will occur whenever a clock pulse occurs and $E_{DC}$ is equal to $V_p$. Of course, it will be appreciated that various other polarity arrangements will be apparent to those skilled in the art in accordance with the present invention.

Figure 3:
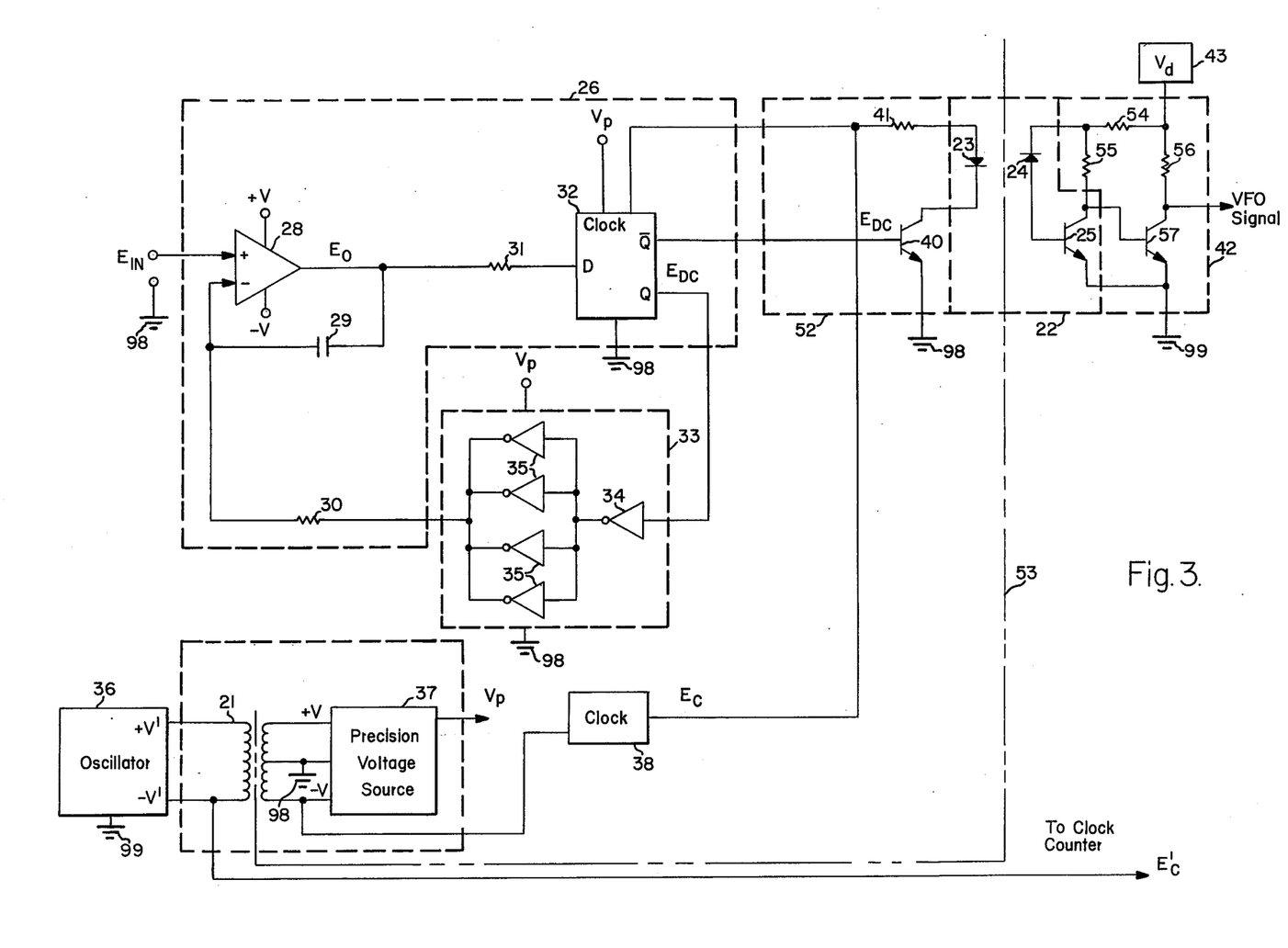
FIG. 3 is a detailed circuit diagram of a preferred VFO circuit utilized in the present invention.

Referring now to FIG. 3, there is shown a detailed circuit diagram showing the preferred embodiment of the present invention which incorporates precision enhancement means 33, preferably CMOS hex inverters, and isolation means which comprises signal isolation means 22 and power isolation means 21. The CMOS hex inverters are preferred because of their ability to cause their output to swing between the positive supply (which is the precision reference voltage) and ground to thereby achieve the desired precision.

Power is supplied to the circuit shown in FIG. 3 by oscillator 36 which provides a voltage $+V'$ and $-V'$ to the primary winding of transformer 21 on one side of isolation plane 53. The secondary winding of transformer 21 is coupled to precision voltage generator 37 which provides the nonprecision voltage $+V$ and $-V$ to operational amplifier 28 and also generates the precision voltage $V_p$ supplied to flip-flop 32 and the VFO pulse enable means 52. The transformer permits power isolation which allows for high common mode input voltage, i.e., a floating input voltage. The clock 38 supplies clock pulses to the circuitry on the input side of isolation 53 and obtains its power from either the plus or minus terminals of the secondary winding of transformer 21. It will be appreciated, however, that the clock may be taken directly from the secondary winding. The clock necessary to drive the circuitry on the output side of isolation plane 53 is obtained from the $+V'$ or $-V'$ terminals of oscillator 36. While any type of periodic oscillating signal wave form may be used, it is preferable that oscillator 36 supply an oscillating square wave. Regardless of the polarity utilized, it is essential that the clock signal $E_c$ on the input side of isolation plane 53 by synchronized with the clock signal $E_c'$ on the output side of isolation plane 53. Of course, if isolation means are not utilized, the clock signals $E_c'$ and $E_c$ may be the same. The circuit shown in FIG. 3 operates in generally the same manner as the circuit previously described and shown in FIG. 2. However, coupled between operational amplifier 28 and clocked threshold flip-flop 32 is first resistor 31 to provide protection for flip-flop 32. The non-inverting output Q of clocked flip-flop 32 is coupled to duty-cycle voltage precision enhancement means 33 which comprises first inverter 34 and a plurality of second inverters 35 coupled in parallel between the output of first inverter 34 and time constant resistor 30. The number of second inverters 35 utilized which are preferably CMOS hex inverters will depend upon the increased enhancement desired. Thus, the more second inverters coupled in parallel, the more precise the fed back $E_{DC}$ voltage will be.

To allow for further precision, the signal used to drive transistor 40 is taken from the inverting output of flip-flop 32. Of course, various polarity modifications in accordance with the present invention will be obvious to those skilled in the art. Signal isolation means is provided by a light emitting means 23 such as a light emitting diode coupled between resistor 41 and the collector of transistor 40. Such a light emitting means provides light modulation in response to voltage variations appearing at the collector of transistor 40. Optically coupled to light emitting means 23 is output unidirectional conducting device 24, for example a photo diode, which is sensitive to optical modulations emanating from light emitting means 23. Output unidirectional conducting device 24 is coupled between the base of transistor 25 and resistor 54. The preferable VFO signal buffering means comprises second resistor 54, third resistor 55, fourth resistor 56 and transistor 57. Digital voltage source 43 supplies voltage $V_d$ to output unidirectional conducting device 24 through resistor 54. Resistor 55 is coupled to the junction between resistor 54 and output unidirectional conducting device 24 on the one side and to the collector of first transistor 25 on the other. The collector of transistor 25 is coupled to the base of transistor 57. The emitter of transistor 25 is coupled to the emitter of transistor 57 which in turn is coupled to a ground 99 which is isolated from ground 98 of the signal on the opposite side of isolation plane 53. Resistor 56 is coupled between the collector of transistor 57 and voltage source 43. The VFO pulse train output then appears at the collector of transistor 57.

The operation of the remainder of the analog to digital converter as shown in FIG. 1 may be understood by reference to FIG. 4f through FIG. 4i. A VFO circuit such as that described in FIG. 2 or FIG. 3 generates a VFO pulse train such as the representative VFO pulse train shown in FIG. 4e. digital word is formed by accumulating the VFO pulses in the VFO pulse accumulator 8. The sample period of the A/D converter during which VFO pulses are accumulated is determined by clock counter 11 which counts the digital clock pulses from digital clock 3 until a predefined number of clock pulses have been counted. A signal is then sent to, or a count detected by, time-gate generator 12 which generates a "load" signal to cause the accumulated count from VFO pulse accumulator 8 to transfer into digital count storage register 9. Immediately thereafter and prior to the forward edge of the next clock pulse, time-gate generator 12 sends a "clear" signal to VFO pulse accumulator 8 to set the count to zero in preparation for the accumulation of the next VFO signal pulse sequence to generate the next digital word. The digital output is then available from digital count storage register 9 either in serial or parallel form.

Referring again to FIG. 4f and 4g, the sample period over which VFO pulse accumulator 8 accumulates the VFO signal pulses is defined to be 32 clock pulses. Thus, the maximum count in VFO pulse accumulator will also be 32. Of course, any number of clock pulses may define the same period and the number 32 is merely utilized for illustrative convenience. Initially, the pulse accumulator 8 is set to zero by clear signal 5 from time-gate generator 12 as shown in FIG. 4f. The VFO signal pulses are accumulated to yield an accumulator reading sequence as illustrated in FIG. 4h. Each count of accumulator 8 is shown in FIG. 4h in both a decimal and binary representation at each accumulation time. At the end of 32 clock pulses, clock counter 11, in conjunction with time-gate generator 12, generate a "load" signal (FIG. 4g) which loads the total count accumulated in accumulator 8 during the prior sample period into digital count storage register 9. At the end of the word number 1 sample period shown in FIG. 4h, this count is equal to 12 or a binary number of 01100. As illustrated in FIG. 4i, this count of 12 will appear in the digital count storage register immediately after the load signal of FIG. 4g occurs and will remain in digital count storage register until word 2 is transferred at the end of the next sample period. Immediately after the VFO pulse accumulator count is transferred, a clear signal from time-gate generator 12 causes the accumulator count to be reset to zero as shown in FIG. 4f and 4h. In addition, it is preferable to also reset or otherwise cause the clock counter to be set to zero at the beginning of each sample period.

The above process repeats itself for the second sample period. At the end of the second accumulation or sample period, a second "load" signal from time-gate generator 12 causes a transfer of the total count from VFO pulse accumulator 8 to digital count storage register 9. In the particular example, this count is equal to 27 or a binary word of 11011 as illustrated in FIG. 4h and 4i. Immediately after the load signal, a clear signal 5 is again generated by time-gate generator 12 to clear the VFO pulse accumulator in preparation for the accumulation of the next word count.

Of critical importance and significance in the present invention is the fact that the VFO circuit and the digital word definition control means 4 which comprises the clock counter 11 and the time-gate generator 12 be synchronized. Thus, the sample period of the analog-to-digital converter is determined by clock counter 11 so that the binary number loaded into digital counter storage register 9 is a fraction of the full scale input frequency normalized to unity. By using the clock signals $E_c$ and $E_c'$ to synchronize the VFO circuit and the time-gate generator, the conversion of frequency to a number is determined by a logical ratio with the overall accuracy being only a fraction of the oscillator's (digital clock's) short-term stability. This eliminates the need for an accurate time gate referred to at page 3 in Motorola Semiconductor Products, Inc., Application Note An-471 entitled "Analog-to-Digital Conversion Techniques."

Summarizing then, the present invention eliminates the accurate time gate during which VFO pulses are accumulated and replaces it by synchronizing the generation of VFO pulses with clock signals $E_c$ and $E_c'$ and thus accumulates VFO pulses during a defined number of clock pulse counts.

While the present invention has been particularly shown and described with reference to preferred embodiments, it will be understood by those skilled in the art that the foregoing and other changes in form and details may be made without departing from the spirit and scope of the invention.

What is claimed is:

1. A voltage-to-frequency conversion circuit adapted to receive an analog signal which varies within a range between two precision voltage levels wherein said circuit comprises:
   power source means to power said circuit and to supply said two precision voltage levels;

clocking means for supplying periodic clock pulses;
analog-to-duty cycle conversion means synchronized with said clocking means for converting the analog signal to a duty-cycle signal having an UP-time to DOWN-time ratio equal to the ratio between the analog signal voltage and the range between said precision voltage levels;
voltage-to-frequency pulse enable means for receiving said duty-cycle signal and coupled to said analog-to-duty cycle conversion means and to said clocking means whereby said clock pulses are enabled at the output of said voltage-to-frequency pulse enable means to form a VFO signal output during the UP-time of the duty cycle signal;
signal isolation means for electrically isolating an analog input signal from the VFO signal output, comprising:
a light emitting diode coupled between said clocking means and the collector of a switching transistor for emitting modulated light in accordance with the UP-DOWN voltage sequence at the collector of said switching transistor; and
light reception means coupled to receive the modulated light for generating a modulated electrical signal, said light reception means comprising;
a light sensor; and
a signal buffer comprising a digital power source for supplying power to said buffer means, a first transistor having its base coupled to one terminal of said light sensor and its emitter at ground potential, a first resistor coupled between said digital power source and the second terminal of said light sensor, a second resistor coupled between the collector of said first transistor and said first resistor, a second transistor having its base coupled to the collector of said first transistor and having its emitter at ground potential, and a third resistor coupled between said digital power source and the collector of said second transistor whereby said VFO signal pulse train appears at the collector of said second transistor.

2. The voltage-to-frequency conversion circuit of claim 1 wherein said analog-to-duty cycle conversion means comprises:
an operational amplifier having inverted and non-inverting inputs adapted to receive the analog input signal at the non-inverting input;
a capacitor coupled between the output of said operational amplifier and the inverting input of said operational amplifier to form a first feedback loop;
a clocked flip-flop having a signal input coupled to the output of said operational amplifier and a clock input coupled to said clocking means to generate an output signal on an output of said flip-flop whereby said flip-flop output changes its voltage state on a first clock pulse after the operational amplifier output signal crosses a flip-flop threshold voltage; and
a time-constant resistor coupled between said inverting input of said operational amplifier and the output of said flip-flop to form a second feedback path.

3. The voltage-to-frequency conversion circuit of claim 2 wherein said analog-to-duty cycle conversion means further comprises:
a first resistor coupled between the output of said operational amplifier and the input of said clocked flip-flop; and
voltage feedback means coupled in said second feedback loop between said time-constant resistor and the output of said clocked flip-flop.

4. The voltage-to-frequency conversion circuit of claim 2 wherein said voltage feedback means comprises:
a first inverter coupled to the output of said flip-flop; and
a plurality of second voltage dividing inverters coupled in parallel between the output of said first inverter and said time-constant resistor to enhance the precision of the duty-cycle voltage in said second feedback path.

5. The voltage-to-frequency conversion circuit of claim 1 wherein voltage-to-frequency pulse enable means comprises clock enable means coupled to said analog-to-duty cycle conversion means wherein said clock signal is enabled to form VFO signal pulses when said duty-cycle signal is in its UP state and said clock signal is disabled to form a constant VFO signal level having a voltage below the voltage of said VFO signal pulses when the duty-cycle signal is in its DOWN state.

6. The voltage-to-frequency conversion circuit of claim 1 wherein said power source means comprises:
oscillation means having a first terminal and a second terminal to supply an osicllating voltage;
power isolational means coupled to said oscillation means to electrically isolate the oscillation means from the VFO signal to achieve a high common mode output voltage; and
precision voltage source coupled to said power isolation means to supply said two precision voltages.

7. The voltage-to-frequency conversion circuit of claim 6 wherein said power isolation means comprises a transformer having a primary winding coupled between the first and second terminals of said oscillation means and a secondary winding electrically isolated from said primary winding coupled to said precision voltage source.

8. An analog to digital converter of the open loop and analog-to-frequency type for converting an analog signal varying within a range of voltage starting at a minimum voltage to a digital output comprising:
clocking means for supplying clock pulses at periodic time intervals;
a voltage-to-frequency conversion circuit coupled to said clock means for receiving and converting the analog signal to a VFO signal pulse train wherein the ratio between the number of VFO signal pulses occuring in a sample period and the total number of clock pulses occurring during said sample period is proportional to the ratio between the actual analog signal voltage above the minimum voltage and the value of the range of voltages within which said analog signal varies, said voltage to frequency conversion circuit comprising:
power source means for powering said circuit and for supplying a first and a second precision voltage level defining a precision voltage range wherein said analog signal voltage range is defined to be equal to said precision voltage range;
analog-to-duty cycle conversion means synchronized with said clocking means for converting the analog signal to a duty cycle signal having an UP-time to DOWN-time ratio equal to the ratio between the analog signal voltage above said minimum voltage and the range between said precision voltages;
voltage-to-frequency pulse enable means coupled to said analog-to-duty cycle conversion means to receive said duty cycle signal and to said clocking means whereby said clock pulses are enabled at the output ot said voltage-to-frequency pulse enable means during the UP-time of the duty cycle signal to form a VFO signal output, said voltage-to-frequency pulse enable means further comprises signal isolation means for electrically isolating an analog input signal from the VFO signal output;

converter control means coupled to said clocking means for counting said clock pulses and periodically generating at least one control signal upon reaching a predefined clock count to thereby define said sample period;

digital signal pulse accumulation-storage means coupled to said voltage-to-frequency conversion means and said converter control means for accumulating all VFO signal pulses generated during the sample period and outputting the total accumulated count at the end of each sample period to thereby form a binary coded word, said clocking means supplying a first clocking signal to said analog-to-duty cycle conversion means and supplying a second clocking signal electrically isolated from but synchronized to said first clocking signal, to said digital signal pulse accumulation-storage means and said converter control means; and a signal isolation circuit comprising, light emitting means, coupled between said clocking means and the collector of a switching transistor, for emitting modulated light in accordance with the UP-DOWN voltage sequence at the collector of said switching transistor, and light reception means, coupled to said light emitting means for generating a modulated electrical signal, said light emitting means comprising a light emitting diode, and said light reception means comprising:

a light sensor; and a signal buffer which comprises a digital power source for supplying power to said signal buffer, a first transistor having its base coupled to one terminal of said light sensor and its emitter being at ground potential, a first resistor coupled between said digital power source and the second terminal of said light sensor, a second resistor coupled between the collector of said first transistor and first resistor, a second transistor having its base coupled to the collector of said first transistor and having its emitter at ground potential, and a third resistor coupled between said digital power source and the collector of said second transistor whereby said VFO signal appears at the collector of said second transistor.

9. The analog-to-digital converter of claim 8 wherein said analog-to-duty cycle conversion means comprises:
an operational amplifier having inverting and non-inverting inputs adaped to receive the analog signal at the non-inverting input;
a capacitor coupled between the output of said operational amplifier and the inverting input of said operational amplifier to form a first feedback loop;
a clocked flip-flop having a signal input coupled to the output of said operational amplifier and a clock input coupled to said clocking means to generate an output signal on an output of said flip-flop whereby said flip-flop output signal changes its voltage state on the first clock pulse after the operational amplifier output signal crosses a threshold voltage; and a time-constant resistor coupled between said inverting input of said operational amplifier and the output of said flip-flop to form a second feedback path.

10. The analog-to-digital converter of claim 9, said analog-to-duty cycle conversion means further comprising:
a first resistor coupled between the output of said operational amplifier and the input of said clocked flip-flop; and
voltage feedback means coupled in said second feedback loop between said time-constant resistor and the output of said clocked flip-flop.

11. The analog-to-digital converter of claim 10 wherein said voltage feedback means comprises:
a first inverter coupled to the output of said flip-flop; and
a plurality of second voltage dividing inverters coupled in parallel between the output of said first inverter and said time-constant resistor to enhance the precision of the duty-cycle voltage in said second feedback path.

12. The analog-to-digital converter of claim 8 wherein said voltage-to-frequency pulse enables means comprises clock enables means coupled to said analog-to-duty cycle conversion means wherein a clock signal is enabled to form VFO signal pulses when a duty-cycle signal is in its UP state and said clock signal is disabled to form a constant VFO signal level having a voltage below the voltage of said VFO signal pulses when the duty-cycle signal is in its DOWN state.

13. The analog-to-digital converter of claim 8 wherein said voltage-to-frequency pulse enable means comprises;
a switching transistor wherein the base of said transistor is coupled to said analog-to-duty conversion means to receive a duty-cycle signal in inverted form and the emitter of said transistor is coupled to ground so that the VFO signal output appears at the collector of said transistor; and
a first resistor coupled between the collector of said transistor and the output of said clocking means whereby said clock signal appears at the collector of said transistor when the transistor is not conducting and the collector of said transistor is at ground when the transistor is conducting.

14. The analog-to-digital converter of claim 8 wherein said power source means comprises:
oscillation means having a first terminal and a second terminal to supply an oscillating voltage;
power isolation means coupled to said oscillation means to electrically isolate the oscillation means from the VFO signal to achieve a high common mode output voltage; and
a precision voltage source coupled to said power isolation means for supplying said first and second precision voltage levels.

15. The analog-to-digital converter of claim 14 wherein said power isolation means comprises a transformer having a primary winding coupled between the first and second terminals of said oscillation means and a secondary winding electrically isolated from said primary winding coupled to said precision voltage source.

16. The analog-to-digital coverter of claim 15 wherein said first clocking signal is derived from the secondary winding of said transformer and said second clocking signal is derived from the primary winding of said transformer.

17. The analog-to-digital converter of claim 8, wherein said converter control means comprises:
- a clock counter for counting clock pulses from said clocking means; and
- time-gate generation means for sensing a predefined count in said clock counter and generating at least one control signal to define a sample period and thereby control the accumulation and storage in said digital signal pulse accumulation-storage means.

18. The analog-to-digital converter of claim 17 wherein said digital signal pulse accumulation-storage means comprises:
- a VFO pulse accumulator for accumulating the individual VFO pulse during the sample period defined by the converter control means; and
- a digital count storage register for periodically receiving the VFO count accumulated in VFO pulse accumulator in response to a control signal from said converter control means.

* * * * *